United States Patent
Hashiguchi et al.

(10) Patent No.: US 6,825,907 B2
(45) Date of Patent: Nov. 30, 2004

(54) TFT ARRAY SUBSTRATE, AND LIQUID CRYSTAL DISPLAY DEVICE USING THE SAME

(75) Inventors: Takafumi Hashiguchi, Kumamoto (JP); Takehisa Yamaguchi, Kumamoto (JP); Naoki Nakagawa, Kumamoto (JP)

(73) Assignee: Kabushiki Kaisha Advanced Display, Kumamoto (JP)

( * ) Notice: Subject to any disclaimer, the term of this patent is extended or adjusted under 35 U.S.C. 154(b) by 0 days.

(21) Appl. No.: 10/049,715

(22) PCT Filed: Jun. 11, 2001

(86) PCT No.: PCT/JP01/04885
§ 371 (c)(1),
(2), (4) Date: Feb. 14, 2002

(87) PCT Pub. No.: WO02/01286
PCT Pub. Date: Jan. 3, 2002

(65) Prior Publication Data
US 2002/0113916 A1 Aug. 22, 2002

(30) Foreign Application Priority Data
Jun. 27, 2000 (JP) ........................................ 2000-193453

(51) Int. Cl.⁷ .................. G02F 1/1343; G02F 1/136
(52) U.S. Cl. .................................. 349/139; 349/43
(58) Field of Search ............................ 349/139, 42, 43

(56) References Cited

U.S. PATENT DOCUMENTS

| 6,476,418 B1 | * | 11/2002 | Shiga et al. | 257/72 |
| 2001/0043292 A1 | * | 11/2001 | Tsujimura et al. | 349/43 |
| 2002/0113915 A1 | * | 8/2002 | Kwak et al. | 349/43 |

FOREIGN PATENT DOCUMENTS

| JP | 63-202719 | 8/1988 |
| JP | 1-282523 | 11/1989 |
| JP | 2-10331 | 1/1990 |
| JP | 6-208130 | 7/1994 |

\* cited by examiner

Primary Examiner—Dung T. Nguyen
(74) Attorney, Agent, or Firm—McDermott Will & Emery LLP

(57) ABSTRACT

The widths of those portions of a semiconductor layer 5 and a drain line 6a overlapping with it which cross an edge line of a gate electrode 2 are made smaller than the channel width of a thin-film transistor. With this measure, the overlap area of the gate electrode 2 and a drain electrode 6 is reduced. As a result, a variation of the above overlap area due to alignment errors in a photolithography apparatus used in patterning the gate lines 2, the drain electrodes 6, and source electrodes 7 can be reduced and the frequency of occurrence of display defects can be decreased.

3 Claims, 5 Drawing Sheets

Prior Art

Prior Art

TFT ARRAY SUBSTRATE, AND LIQUID CRYSTAL DISPLAY DEVICE USING THE SAME

TECHNICAL FIELD

The present invention relates to an active matrix TFT array substrate incorporating thin-film transistors (hereinafter referred to as "TFTs") as switching elements as well as to a liquid crystal display device using it.

BACKGROUND ART

FIG. 7(a) is a plan view showing one pixel of a conventional TFT array substrate, FIG. 7(b) is a plan view showing a TFT portion as a switching element, and FIG. 7(c) is a sectional view taken along line D–D' in FIG. 7(b). In the figures, reference numeral 1 denotes a transparent insulative substrate; 2, a plurality of gate lines formed on the transparent insulative substrate 1 and gate electrodes provided in the gate lines; 3, a plurality of source lines that have source electrodes 7 and cross the gate lines 2; and 5, a semiconductor layer formed on each gate electrode 2 with a gate insulating film 4 interposed in between. A source electrode 7 and a drain electrode 6 that are connected to the semiconductor layer 5 constitute a TFT. Reference numeral 8 denotes a pixel electrode that is a transparent conductive film and is connected to the drain electrode 6 through a contact hole 10 that is formed through an interlayer insulating film 9. Reference numeral 11 represents a channel width.

A manufacturing method of the conventional TFT array substrate will be described below briefly. Firstly, a metal film of Cr or the like is deposited on a transparent insulative substrate 1 by sputtering method or the like and then patterned by photolithography method or the like, whereby gate lines 2 including gate electrodes are formed. Then, a gate insulating film 4 and a semiconductor layer 5 are deposited consecutively by plasma CVD method or the like. After semiconductor layers 5 are patterned, a metal film is deposited and drain electrodes 6, source electrodes 7, and source lines 3 are formed. Then, an interlayer insulating film 9 made of silicon nitride or the like is formed so as to cover the TFTs. After contact holes 10 are formed, pixel electrodes 8 that are transparent conductive films made of ITO or the like are formed by sputtering method or the like. A TFT array substrate is thus completed.

A liquid crystal display device performs video display by controlling a liquid crystal interposed between the above-described TFT array substrate and a counter electrode substrate according to voltages that are applied between the pixel electrodes 8 on the array substrate and the counter electrode. In this case, if the voltages applied to the pixel electrodes 8 vary in the display area, display defects such as luminance unevenness, shot unevenness, a flicker, etc. may occur.

FIG. 8 shows a relationship between a pixel electrode voltage and each signal voltage. In the figure, reference character A denotes a gate electrode voltage, B denotes a pixel electrode voltage, and C denotes a source electrode voltage. In a charging period CP in which the gate electrode voltage A turns on the TFT, the pixel electrode voltage B is applied to the source electrode 7 and transmitted to the pixel electrode 8 via the drain electrode 6. The pixel electrode voltage B reaches the source electrode voltage C in the charging period CP. However, when the gate electrode voltage A turns off as a transition occurs from the charging period CP to a holding period HP, the pixel electrode voltage B lowers due to capacitance coupling etc. This voltage drop at the pixel electrode 8 is a feedthrough voltage D, which is expressed by the following equation in a simplified manner. In the equation, $\Delta Vgd$ is a feedthrough voltage, $Cgd$ is a parasitic capacitance between the gate electrode and the drain electrode, $Cs$ is an auxiliary capacitance of the pixel electrode, and $Clc$ is a liquid crystal capacitance.

$$\Delta Vgd = \Delta V \times Cgd/(Clc+Cs+Cgd)$$

One of factors of varying the feedthrough voltage in the display area is a variation of the parasitic capacitance (hereinafter referred to as Cgd) between the gate electrode 2 and the drain electrode 6. In the array substrate in which the pixels and the TFTs are arranged in matrix form, each pattern is formed by photolithography method and one manufacturing step is completed by using a plurality of shots. If an alignment error occurs in each shot in a photolithography apparatus, the pattern arrangement relationships among the gate electrode 2, the semiconductor layer 5, the source electrode 7, the drain electrode 6, etc. vary from one shot to another. Therefore, Cgd which is determined by the overlap area of the gate electrode 2 and the drain electrode 6 varies from one shot to another. As a result, the feedthrough voltage varies from one shot to another and shot unevenness, a flicker, etc. become easy to recognize visually. Further, a portion of the semiconductor layer 5 that is located over the gate line 2 and is located outside the drain electrode 6 is kept at the same potential as the potential of the drain electrode 6 until the gate electrode voltage A turns off. This also contributes to the Cgd variation.

In the conventional TFT structure shown in FIG. 7, alignment errors in the direction parallel with the channel width 11 direction of the TFT cause only small variations in the areas of overlap between the gate line 2, the drain electrode 6, and the semiconductor layer 5. However, there is a problem that no consideration is given to alignment errors in the direction perpendicular to the channel width 11 and such alignment errors cause large variations in areas. Further, in the conventional structure, the load capacitance of the gate line 2 is large. It is desired to decrease it.

Japanese laid Opened Patent Publication No. Hei. 2-10331, for example, proposes a TFT array substrate in which that part of a drain electrode which is formed, with a gate insulating film interposed in between, on a step portion that is formed by the presence of a gate electrode is made narrower than the other portion of the drain electrode, to thereby prevent short-circuiting between layers arranged in the vertical direction that would otherwise occur due to the presence of the step portion. However, this publication has no disclosure relating to the width of a semiconductor layer on the step portion.

DISCLOSURE OF THE INVENTION

The present invention has been made to solve the above problems, and an object of the invention is to provide a TFT array substrate having a large aperture ratio in which the frequency of occurrence of display defects such as shot unevenness and a flicker due to alignment errors in a photolithography apparatus in an array substrate manufacturing process can be decreased and the load capacitance of the gate line can be reduced, as well as a liquid crystal display device using it.

Means provided by the invention to solve the above problems will be described below. The invention provides a TFT array substrate comprising a plurality of gate lines formed on an insulative substrate, each of the gate lines including a gate electrode, a plurality of source lines crossing the gate lines, each of the source lines including a source electrode, a semiconductor layer formed on the gate electrode with a gate insulating film interposed in between, a thin-film transistor formed by the source electrode and a drain electrode, the source electrode and the drain electrode are connected to the semiconductor layer, and a pixel electrode connected to a drain line extending from the drain electrode, characterized in that the widths of crossing portions of the semiconductor layer and the drain line overlapping with it that cross an edge line of the gate electrode are made smaller than the width of the drain electrode that is equal to a channel width of the thin-film transistor.

Further, the drain electrode and the drain line have portions that are located over the gate electrode and do not coextend with the semiconductor layer.

The invention also provides a TFT array substrate comprising a plurality of gate lines formed on an insulative substrate, each of the gate lines including a gate electrode, a plurality of source lines crossing the gate lines, each of said source lines including a source electrode, a semiconductor layer formed on the gate electrode with a gate insulating film interposed in between, a thin-film transistor formed by the source electrode and a drain electrode, the source electrode and the drain electrode are connected to the semiconductor layer, and a pixel electrode having a pixel line connected to the drain electrode, characterized in that the widths of crossing portions of the semiconductor layer and the pixel line overlapping with it that cross an edge line of the gate electrode are made smaller than the width of the drain electrode that is equal to a channel width of the thin-film transistor.

Further, the drain electrode and the pixel line have portions that are located over the gate electrode and do not coextend with the semiconductor layer.

The invention also provides a TFT array substrate comprising a plurality of gate lines formed on an insulative substrate, each of the gate lines including a gate electrode, a plurality of source lines crossing the gate lines, each of the source lines including a source electrode, a semiconductor layer formed on the gate electrode with a gate insulating film interposed in between, a thin-film transistor formed by the source electrode and a drain electrode, the source electrode and the drain electrode are connected to the semiconductor layer, and a pixel electrode having a pixel line connected to the drain electrode, characterized in that the width of a crossing portion of the pixel line that crosses an edge line of the gate electrode is made smaller than the width of the drain electrode that is equal to a channel width of the thin-film transistor.

Further, the drain electrode has a portion that is located over the gate electrode and does not coextend with the semiconductor layer.

A liquid crystal display device characterized in that a liquid crystal is interposed between one of the above TFT array substrates and a counter electrode substrate having a transparent electrode, color filters, etc. or a counter electrode substrate having a transparent electrode.

Advantages of the invention will be described below. As described above, according to the invention, in a TFT array substrate comprising a plurality of gate lines formed on an insulative substrate, each of the gate lines including a gate electrode, a plurality of source lines crossing the gate lines, each of the source lines including a source electrode, a semiconductor layer formed on the gate electrode with a gate insulating film interposed in between, a thin-film transistor formed by the source electrode and a drain electrode, the source electrode and drain electrode are connected to the semiconductor layer, and a pixel electrode connected to a drain line extending from the drain electrode, the widths of crossing portions of the semiconductor layer and the drain line overlapping with it that cross an edge line of the gate electrode are made smaller than the width of the drain electrode that is equal to a channel width of the thin-film transistor. Therefore, differences in the overlap area of the gate electrode and the drain electrode between shots that occur due to alignment errors in a photolithography apparatus used in patterning the gate electrodes, the drain electrodes, and the source electrodes become small, whereby the variation of the parasitic capacitance which is a parameter representing the feedthrough voltage can be reduced and hence the frequency of occurrence of display defects such as shot unevenness and a flicker can be decreased.

Further, the drain electrode and the drain line have a portions that are located over the gate electrode and do not coextend with the semiconductor layer. Therefore, the area of the semiconductor layer that is located outside the drain electrode and the drain line becomes small and the capacitance formed by the gate electrode and the portion of the semiconductor layer that is located outside the drain electrode becomes small and hence has almost no influence on the feedthrough voltage. Therefore, the frequency of occurrence of display defects such as shot unevenness and a flicker can further be decreased. Still further, the invention can make the load capacitance of the gate line smaller than in the conventional TFT structure. In addition, employment of the pixel line makes it possible to provide a TFT array substrate having a larger aperture ratio than conventional ones do, as well as a liquid crystal display device having superior display characteristics.

BEST MODE FOR CARRYING OUT THE INVENTION

Embodiment 1

Figure 1:
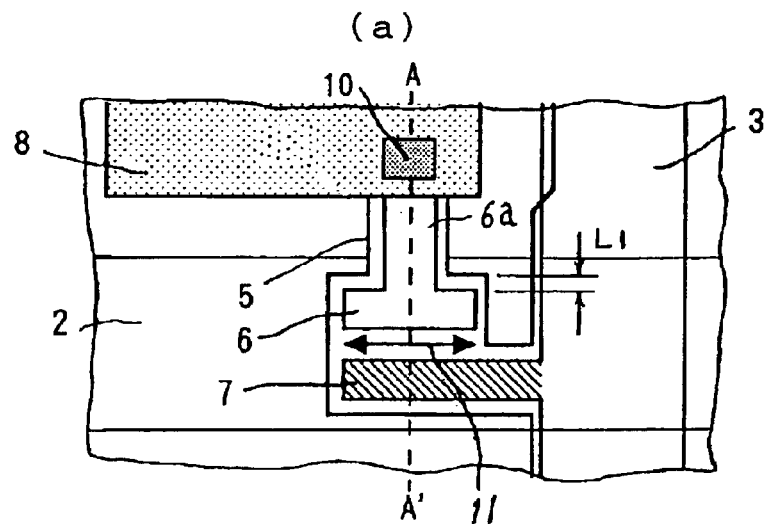
FIGS. 1(a) and 1(b) are a plan view and a sectional view, respectively, showing the structure of a TFT array substrate according to a first embodiment of the present invention.
Figure 1:
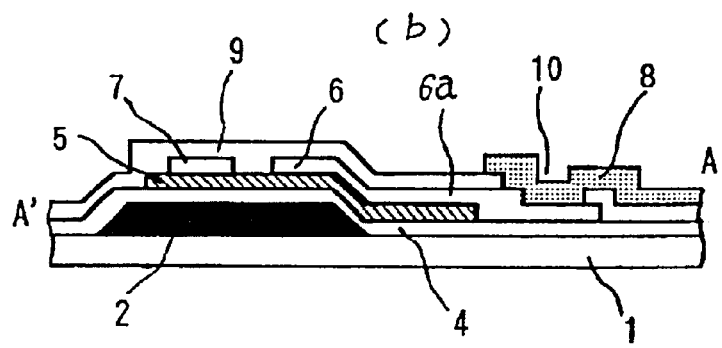

Embodiments of the present invention will be hereinafter described with reference to the drawings. FIG. 1(a) is a plan view showing a TFT portion as a switching element of a TFT array substrate according to a first embodiment of the invention, and FIG. 1(b) is a sectional view taken along line A–A' in FIG. 1(a).

In the figures, reference numeral 1 denotes a transparent insulative substrate; 2, a plurality of gate lines formed on the transparent insulative substrate 1 and gate electrodes provided in the gate lines; and 3, a plurality of source lines that have source electrodes 7 and cross the gate lines 2. Reference numeral 5 denotes a semiconductor layer formed on each gate electrode 2 with a gate insulating film 4 interposed in between. A source electrode 7 and a drain electrode 6 that are connected to the semiconductor layer 5 constitute a TFT. Reference numeral 8 denotes a pixel electrode that is a transparent conductive film and is connected to a drain line 6a extending from the drain electrode 6 through a contact hole 10 that is formed through an interlayer insulating film 9. Reference numeral 11 represents a channel width of the TFT.

In this embodiment, the widths of those crossing portions of the semiconductor layer 5 and the drain line 6a overlapping with it which cross the edge line of the gate electrode 2 are made smaller than the width of the drain electrode 6 that is equal to the channel width 11 of the TFT.

A manufacturing method of the TFT array substrate according to this embodiment will be described below briefly. Firstly, a metal film of Cr or the like is deposited on a transparent insulative substrate 1 by sputtering method or the like. After a resist is exposed to light by photolithography method or the like, the metal film is patterned, whereby gate lines 2 including gate electrodes are formed. Then, a gate insulating film 4 and a semiconductor layer 5 are deposited consecutively by plasma CVD method or the like. After the semiconductor layer 5 is patterned, a metal film of Cr or the like is deposited by sputtering method or the like and drain electrodes 6, drain lines 6a, source lines 3, and source electrodes 7 are formed. Then, an interlayer insulating film 9 made of silicon nitride or the like is formed so as to cover the TFTS. After contact holes 10 to be used for connecting the drain lines 6a to the respective pixel electrodes 8 are formed, a transparent conductive film made of ITO or the like is formed by sputtering method or the like and pixel electrodes 8 are patterned. A TFT array substrate according to this embodiment is thus completed. A liquid crystal display device according to this embodiment is obtained by interposing a liquid crystal between this TFT substrate and a counter electrode substrate having a transparent electrode, color filters, etc. or a counter electrode substrate having a transparent electrode.

Figure 7:
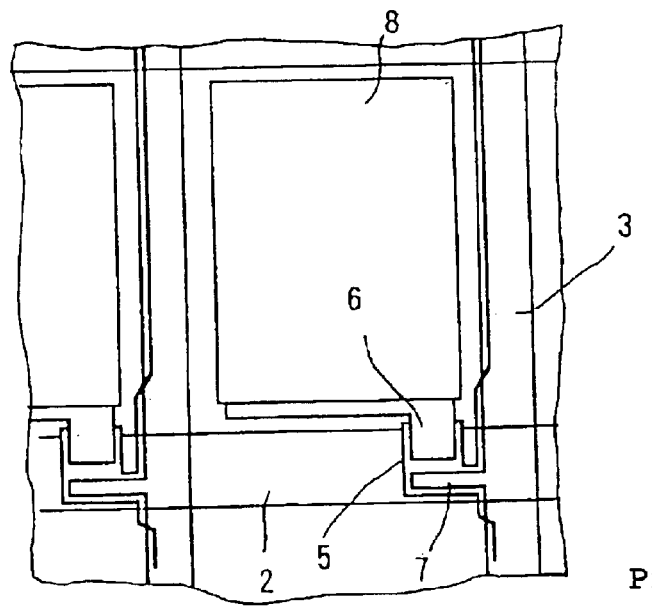
FIGS. 7(a) and 7(b) are plan views and FIG. 7(c) is a sectional view showing the structure of a conventional TFT array substrate.
Figure 7:
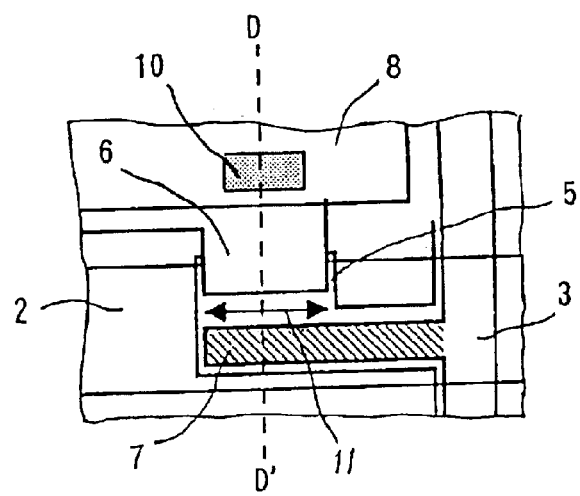
Figure 7:
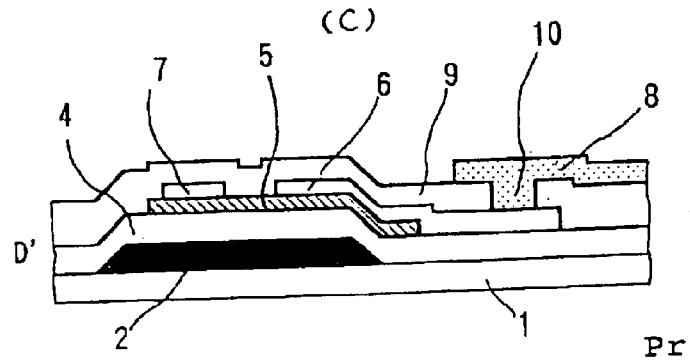
Figure 8:
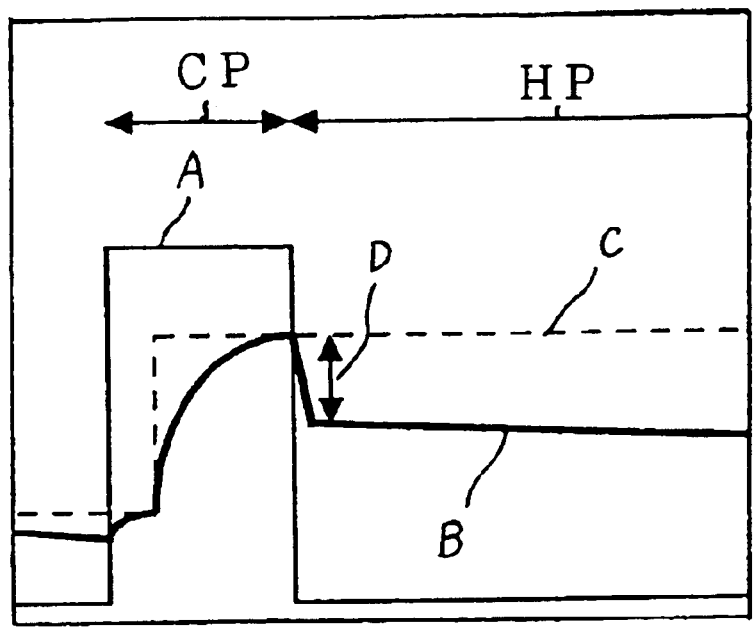
FIG. 8 shows a relationship between a pixel electrode voltage and each signal voltage.

In this embodiment, the widths of those crossing portions of the semiconductor layer 5 and the drain line 6a overlapping with it which cross the edge line of the gate electrode 2 are made smaller than the width of the drain electrode 6 that is equal to the channel width 11 of the TFT. With this measure, differences in the overlap area of the gate electrode 2 and the drain electrode 6 between shots that occur due to alignment errors in a photolithography apparatus used in patterning the gate electrodes 2, the drain electrodes 6, and the source electrodes 7 become smaller than in the conventional TFT structure (see FIG. 7(b)). Therefore, the variation of Cgd which is a parameter representing the feedthrough voltage can be reduced and the frequency of occurrence of display defects such as shot unevenness and a flicker can be decreased. Further, also decreasing the width of the semiconductor layer 5 bridging the end of the gate electrode 2 that contributes to Cgd can prevent a Cgd variation. In particular, whereas in the conventional TFT structure consideration is given to only alignment errors in the direction parallel with the channel width direction, in this embodiment consideration is given to alignment errors in the direction perpendicular to it. As such this embodiment can reduce a Cgd variation in every direction.

The portion of the semiconductor layer 5 that is formed over the gate electrode 2 contributes to Cgd. In a range that the distance L1 between one sideline of the drain electrode 6 and one sideline of the semiconductor layer 5 is longer than about 5 μm, the feedthrough voltage due to the semiconductor layer 5 increases steeply with respect to the distance L1. Therefore, it is desirable that L1 be designed so as to be smaller than 5 μm.

The conventional TFT structure has a problem that short-circuiting tends to occur between the gate electrode 2 and the drain electrode 6 in the step portion where the drain electrode 6 bridges the end of the gate electrode 2 with the gate insulating film 4 interposed in between. In contrast, in this embodiment, since the drain line 6a is employed and hence the drain electrode is made narrower in the step portion, the probability of occurrence of short-circuiting can be decreased. Further, disconnection can also be prevented by making the drain line 6a thicker.

Embodiment 2

Figure 2:
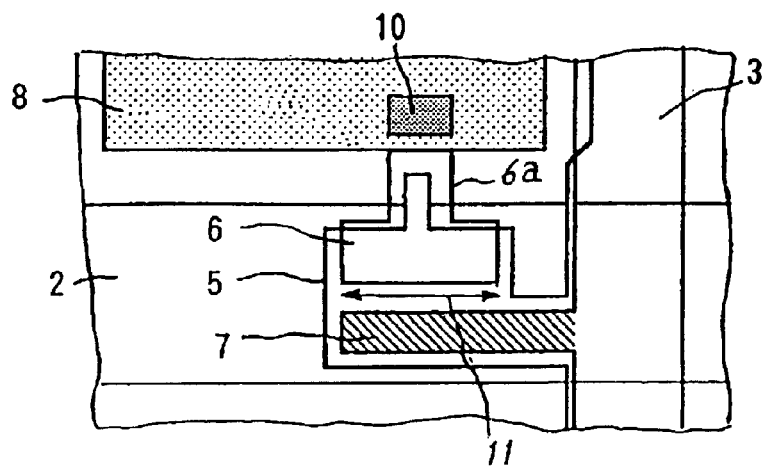
FIG. 2 is a plan view showing a TFT portion as a switching element of a TFT array substrate according to a second embodiment of the invention.

FIG. 2 is a plan view showing a TFT portion as a switching element of a TFT array substrate according to a second embodiment of the invention. The same or corresponding parts are given the same symbols in the figure and will not be described.

In this embodiment, as same as the first embodiment, the widths of those crossing portions of the semiconductor layer 5 and the drain line 6a overlapping with it which cross the edge line of the gate electrode 2 are made smaller than the width of the drain electrode 6 that is equal to the channel width 11 of the TFT. In addition, the drain electrode 6 and the drain line 6a have portions that are located over the gate electrode 2 and do not coextend with the semiconductor layer 5. With this measure, the area of the portion of the semiconductor layer 5 that is located over the gate electrode 2 and is located outside the drain electrode 6 is made smaller than in the first embodiment.

In the above-described TFT structure according to the first embodiment (see FIG. 1(a)), the area of the portion of the semiconductor layer 5 that is located over the gate electrode 2 and is located outside the drain electrode 6 is large and hence it may influence the feedthrough voltage. In view of this, in the embodiment, the drain electrode 6 and the drain line 6a have the portions that are located over the gate electrode 2 and do not coextend with the semiconductor layer 5, whereby the area of the portion of the semiconductor layer 5 that is located outside the drain electrode 6, that is, the portion of the semiconductor layer 5 that will have the same potential as the drain electrode 6 will. As a result, the value of Cgd which is a parameter representing the feedthrough voltage is almost entirely determined by the overlap area of the drain electrode 6 and the gate electrode 2.

This embodiment provides the following advantage in addition to the advantages of the first embodiment. By decreasing the area of the portion of the semiconductor layer 5 that is located outside the drain electrode 6, the capacitance formed by the gate electrode 2 and the portion of the semiconductor layer 5 that is located outside the drain electrode 6 can be reduced (this capacitance contributes to Cgd). Therefore, the feedthrough voltage is prevented from increasing and the frequency of occurrence of shot unevenness and a flicker can further be decreased.

Embodiment 3

Figure 3:
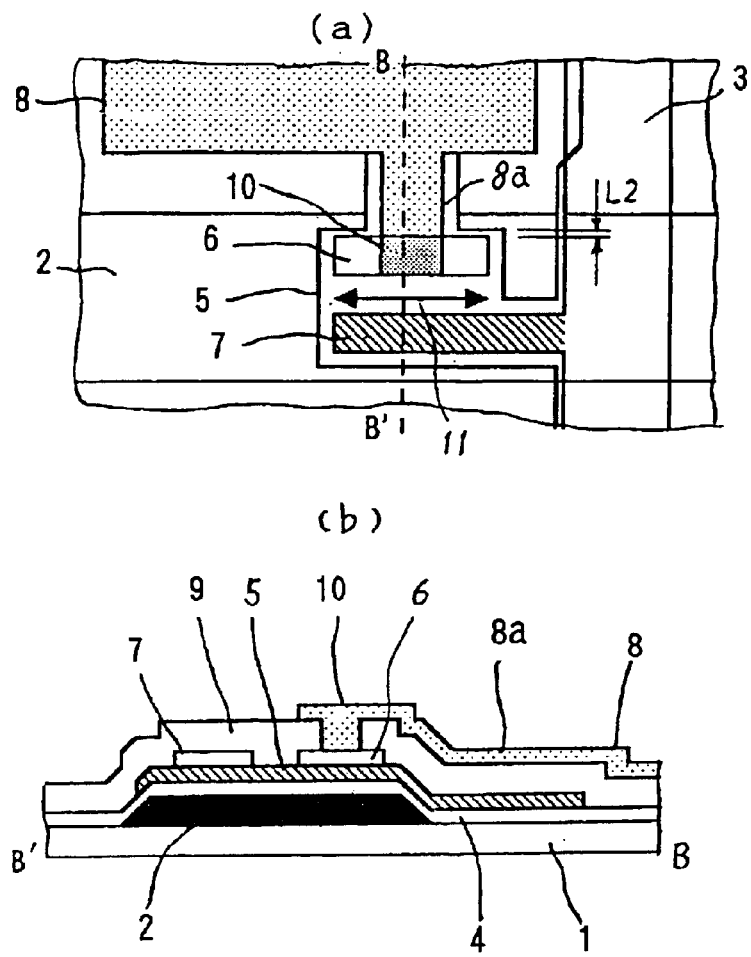
FIGS. 3(a) and 3(b) are a plan view and a sectional view, respectively, showing the structure of a TFT array substrate according to a third embodiment of the present invention.

FIG. 3(a) is a plan view showing a TFT portion as a switching element of a TFT array substrate according to a third embodiment of the invention, and FIG. 3(b) is a sectional view taken along line B–B' in FIG. 3(a). In the figures, reference symbol 8a denotes a pixel line that extends from the pixel electrode 8 and is connected to the drain electrode 6. In the figures, the same or corresponding parts are given the same symbols. The manufacturing method of the TFT array substrate according to this embodiment is approximately the same as in the first embodiment except that pixel electrodes 8 having pixel lines 8a are patterned and the pixel lines 8a are connected to drain electrodes 6 through contact holes 10, and hence will not be described.

In this embodiment, in the TFT array substrate in which the drain electrode 6 of the TFT is formed on the semiconductor layer 5 that is formed on the gate electrode 2, the contact hole 10 is formed above the drain electrode 6, and the drain electrode 6 is electrically connected to the pixel line 8a, the widths of those crossing portions of the semiconductor layer 5 and the pixel line 8a overlapping with it which cross the edge line of the gate electrode 2 are made smaller than the width of the drain electrode 6 that is equal to the channel width 11 of the TFT. With this measure, differences in the area of overlap between the gate electrode 2 and the drain electrode 6 (and the pixel line 8a) between shots that occur due to alignment errors in a photolithography apparatus become smaller than in the conventional TFT structure (see FIG. 7(b)). Therefore, the variation of Cgd which is a parameter representing the feedthrough voltage can be reduced and the frequency of occurrence of shot unevenness and a flicker can be decreased.

The portion of the semiconductor layer 5 that is formed over the gate electrode 2 contributes to Cgd. In a range that the distance L2 between one sideline of the drain electrode 6 and one sideline of the semiconductor layer 5 (see FIG. 3(a)) is longer than about 5 μm, the feedthrough voltage due to the semiconductor layer 5 increases steeply with respect to the distance L2. Therefore, it is desirable that L2 be designed so as to be smaller than 5 μm.

Embodiment 4

Figure 4:
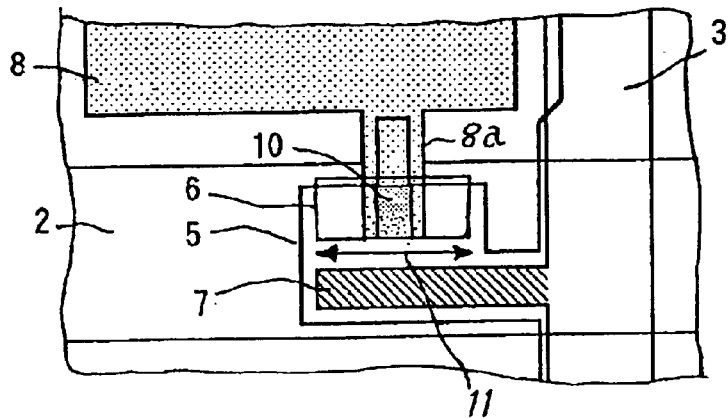
FIG. 4 is a plan view showing a TFT portion as a switching element of a TFT array substrate according to a fourth embodiment of the invention.

FIG. 4 is a plan view showing a TFT portion as a switching element of a TFT array substrate according to a fourth embodiment of the invention. The same or corresponding parts are given the same symbols in the figure and will not be described.

In this embodiment, as in the third embodiment, the widths of those crossing portions of the semiconductor layer 5 and the pixel line 8a overlapping with it which cross the edge line of the gate electrode 2 are made smaller than the width of the drain electrode 6 that is equal to the channel width 11 of the TFT. In addition, the drain electrode 6 and the electrode line 8a have portions that are located over the gate electrode 2 and do not coextend with the semiconductor layer 5. With this measure, the area of the portion of the semiconductor layer 5 that is located over the gate electrode 2 and is located outside the drain electrode 6 and the pixel line 8a is made smaller than in the third embodiment.

This embodiment provides the following advantage in addition to the advantages of the third embodiment. The capacitance formed by the gate electrode 2 and the portion of the semiconductor layer 5 that is located outside the drain electrode 6 and the pixel line 8a can be reduced (this capacitance contributes to Cgd). Therefore, the feedthrough voltage is prevented from increasing and the frequency of occurrence of shot unevenness and a flicker can further be decreased.

Embodiment 5

Figure 5:
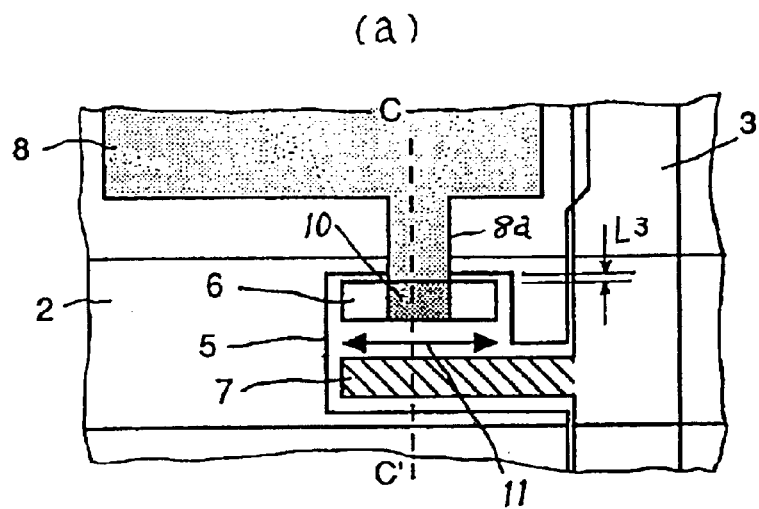
FIGS. 5(a) and 5(b) are a plan view and a sectional view, respectively, showing the structure of a TFT array substrate according to a fifth embodiment of the present invention.
Figure 5:
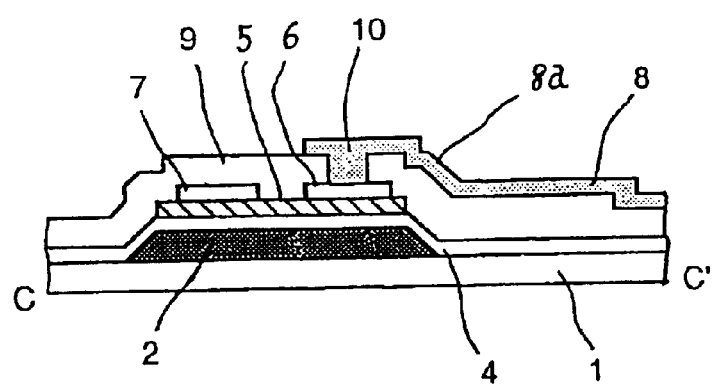

FIG. 5(a) is a plan view showing a TFT portion as a switching element of a TFT array substrate according to a fifth embodiment of the invention, and FIG. 5(b) is a sectional view taken along line C–C' in FIG. 5(a). The same or corresponding parts are given the same symbols in the figures and will not be described.

In this embodiment, in the TFT array substrate in which the drain electrode 6 of the TFT is formed on the semiconductor layer 5 that is formed on the gate electrode 2, the contact hole 10 is formed above the drain electrode 6, and the drain electrode 6 is electrically connected to the pixel line 8a, the width of the crossing portion at the step portion of the pixel line 8a that crosses the edge line of the gate electrode 2 is made smaller than the width of the drain electrode 6 that is equal to the channel width 11 of the TFT. With this measure, differences in the area of overlap between the gate electrode 2 and the drain electrode 6 (and the pixel line 8a) between shots that occur due to alignment errors in a photolithography apparatus become smaller than in the conventional TFT structure (see FIG. 7(b)). Therefore, the variation of Cgd which is a parameter representing the feedthrough voltage can be reduced and the frequency of occurrence of shot unevenness and a flicker can be decreased.

The portion of the semiconductor layer 5 that is formed over the gate electrode 2 contributes to Cgd. In a range that the distance L3 between one sideline of the drain electrode 6 and one sideline of the semiconductor layer 5 (see FIG. 5A) is longer than about 5 μm, the feedthrough voltage due to the semiconductor layer 5 increases steeply with respect to the distance L3. Therefore, it is desirable that L3 be designed so as to be smaller than 5 μm.

Embodiment 6

Figure 6:
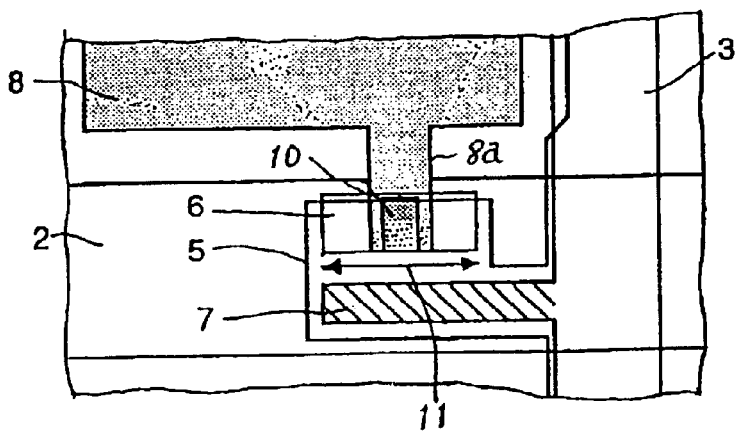
FIG. 6 is a plan view showing a TFT portion as a switching element of a TFT array substrate according to a sixth embodiment of the invention.

FIG. 6 is a plan view showing a TFT portion as a switching element of a TFT array substrate according to a sixth embodiment of the invention. The same or corresponding parts are given the same symbols in the figure and will not be described.

In this embodiment, as in the fifth embodiment, the width of the crossing portion of the pixel line 8a that crosses the edge line of the gate electrode 2 is made smaller than the width of the drain electrode 6 that is equal to the channel width 11 of the TFT. In addition, the drain electrode 6 has a portion that is located over the gate electrode 2 and does not coextend with the semiconductor layer 5. With this measure, the area of the portion of the semiconductor layer 5 that is located over the gate electrode 2 and is located outside the drain electrode 6 is made smaller than in the fifth embodiment.

This embodiment provides the following advantage in addition to the advantages of the fifth embodiment. The capacitance formed by the gate electrode 2 and the portion of the semiconductor layer 5 that is located outside the drain electrode 6 can be reduced (this capacitance contributes to Cgd). Therefore, the feedthrough voltage is prevented from increasing and the frequency of occurrence of shot unevenness and a flicker can further be decreased.

The shapes of the drain electrode 6, the drain line 6a, the pixel line 8a, and the semiconductor layer 5 in the first to sixth embodiments are not limited to those shown in the figures. Similar advantages are expected with arbitrary patterns as long as the width of the portion of the drain line 6a or the pixel line 8a that bridges the end of the gate line 2 is smaller than the width of the drain electrode 6 that is equal to the channel width 11 of the TFT.

In designing patterns of the gate electrode 2, the semiconductor layer 5, and the drain electrode 6 that constitute the TFT, it is desirable to make a variation of the feedthrough voltage due to occurrence of alignment errors between shots smaller than about 150 mV.

The application range of the invention is not limited to the TFT structures described in the above first to sixth embodiments. For example, similar advantages can be obtained also in a TFT in which a drain electrode and a source electrode are formed over a projection-shaped gate electrode extending from a gate line, by making the widths of those portions of a semiconductor layer and a drain line or a metal pattern such as a pixel line that is electrically connected to a pixel which belong to a step portion that is formed by presence of the gate electrode smaller than the channel width of the TFT.

Industrial Applicability

The TFT array substrate according to the invention is used in a liquid crystal display device and is effective in decreasing the frequency of occurrence of display defects of the liquid crystal display device and reducing the load capacitance of the gate line. Further, the liquid crystal display device according to the invention is used as display panels of various display devices.

What is claimed is:

1. A TFT array substrate comprising;
   a plurality of gate lines formed on an insulative substrate, each of the gate lines includes a gate electrode,
   a plurality of source lines crossing the gate lines, each of the source lines includes a source electrode,
   a semiconductor layer formed on the gate electrodes with a gate insulating film interposed in between,
   a thin-film transistor formed by the source electrode and a drain electrode, the source electrode and a drain electrode are connected to the semiconductor layer, and
   a pixel electrode connected to a drain line extending from the drain electrode,
   wherein a width of a crossing portion of the semiconductor layer and a width of a crossing portion of the drain line overlapping with the semiconductor layer that cross an edge line of the gate electrode are made smaller than a width of the drain electrode that is equal to a channel width of the thin-film transistor.

2. The TFT array substrate according to claim 1, wherein the drain electrode and the drain line have portions that are located over the gate electrode and do not coextend with the semiconductor layer.

3. A liquid crystal display device characterized in that a liquid crystal is interposed between the TFT array substrate according to claim 1 and a counter electrode substrate having a transparent electrode.

* * * * *